United States Patent [19]

Yoshida et al.

[11] 4,377,607
[45] Mar. 22, 1983

[54] PROCESS FOR PRODUCING VACUUM DEPOSITION FILMS

[75] Inventors: Satoshi Yoshida; Hideaki Takeuchi; Masamichi Shigyo; Toshio Iijima; Tomoaki Ikeda, all of Asaka, Japan

[73] Assignee: Fuji Photo Film Company, Ltd., Minami-ashigara, Japan

[21] Appl. No.: 259,753

[22] Filed: May 1, 1981

Related U.S. Application Data

[63] Continuation of Ser. No. 96,270, Nov. 21, 1979, abandoned.

[30] Foreign Application Priority Data

Nov. 21, 1978 [JP] Japan ............................. 53-143859

[51] Int. Cl.³ ...................... C23C 11/00; C23C 13/00
[52] U.S. Cl. .................................. 427/250; 427/255.2; 427/255.3; 427/294; 427/296
[58] Field of Search ................ 427/250, 251, 255.2, 427/248.1, 296, 294, 434.6, 255.3; 148/6.3, 6.31, 6.35

[56] References Cited

U.S. PATENT DOCUMENTS

| | | | |
|---|---|---|---|
| 2,382,432 | 8/1945 | McManus et al. | 427/250 |
| 2,759,861 | 8/1956 | Collins et al. | 427/250 |
| 3,363,998 | 1/1968 | Keister et al. | 427/250 |
| 3,415,672 | 12/1968 | Levinstein et al. | 427/250 |
| 3,520,716 | 7/1970 | Okamoto et al. | 427/250 |
| 3,911,177 | 10/1975 | Humbert et al. | 427/250 |
| 4,016,305 | 4/1977 | Wakabayashi et al. | 427/250 |

FOREIGN PATENT DOCUMENTS

1235412  6/1971  United Kingdom ................ 427/250

OTHER PUBLICATIONS

Light, "Evaporating Materials with Elements Having Dissimilar Vapor Pressures," IBM Technical Disclosure Bulletin, vol. 12, No. 1, Jun. 1969.

Burkhart et al, "Process for Evaporating Alloy Films," IBM Technical Disclosure Bulletin, vol. 20, No. 1, Jun. 1977.

*Primary Examiner*—S. L. Childs
*Attorney, Agent, or Firm*—Sughrue, Rothwell, Mion, Zinn, Macpeak & Seas

[57] ABSTRACT

In a process for producing vacuum deposition films which comprises providing a vacuum deposition film composed of an alloy or an intermetallic compound of two or more components having different vapor pressures at a specified temperature on a base, the improvement which comprises charging the component having the lower vapor pressure at said temperature to an evaporation source in a vacuum evaporation chamber in such an amount that the evaporation amount thereof per unit time does not substantially vary, and carrying out vacuum evaporation while continuously feeding a component having a higher vapor pressure at said temperature into said evaporation source in an amount corresponding to the evaporation amount thereof per unit time.

7 Claims, 5 Drawing Figures

PROCESS FOR PRODUCING VACUUM DEPOSITION FILMS

This is a continuation of application Ser. No. 96,270, filed Nov. 21, 1979, now abandoned.

BACKGROUND OF THE INVENTION

1. Field of the Invention

The present invention relates to a process for producing vacuum deposition films composed of an alloy or an intermetallic compound composed of two or more components having different vapor pressures and to a process for producing vacuum deposition films with good reproducibility regardless of the evaporation time and without variations in the composition of the vacuum deposition film. Particularly, it relates to a process for producing vacuum deposition films which comprises continuously forming a vacuum deposition film composed of an alloy or a compound having a definite composition on an indefinite length base or sheet.

2. Description of the Prior Art

When vacuum evaporation is carried out using an alloy or an intermetallic compound of components having different vapor pressures by means of a single evaporation source, the composition of the vacuum deposition film is generally very different from the composition of the evaporating material because of the difference in the vapor pressure and the evaporation rate of each component.

Combinations of metals, namely, alloys in which the composition of the resulting vacuum deposition film is substantially the same as that of the evaporating material, have been described in *Vacuum Deposition of Thin Films*, by Holland, Chapman and Hall Ltd. (1963), page 188. However, they are quite exceptional and are very unique combinations.

Hitherto, though various processes have been proposed for producing the vacuum deposition films of an alloy or an intermetallic compound of two components having different vapor pressures, they all have faults on practical use.

For example, there is the so-called simultaneous vacuum evaporation process which comprises evaporating each component by means of respective evaporation sources and producing a vacuum deposition film having the desired composition by controlling the evaporation rate of each component. However, there are many difficulties such as in controlling the evaporation rate of elements from each evaporation source, the geometric arrangement of each evaporation source or of the evaporation source and the base, or radiant heat from each evaporation source applied to the base, etc. Thus, in order to produce the vacuum deposition films of the alloy or the intermetallic compound having a composition within a definite range, it is necessary to control the evaporation rate of each component. For this purpose, a precise control apparatus is necessary. Particularly, in case of continuous vacuum evaporation, this control is very difficult to carry out, because the volume of the evaporation sources is large. Further, in the case of continuous vacuum evaporation the volume to be evacuated is large due to the large volume required by two evaporation sources therein, by which it becomes necessary to provide a large scale evacuation apparatus having a high evacuation ability and thus costs for equipment, operation and maintenance cannot be disregarded.

A process for producing the vacuum deposition films of the alloy or the intermetallic compound using a single evaporation source has been proposed. It comprises continuously dropping a powdery evaporating material composed of the alloy or the compound in a suitable amount into the evaporation source and instantaneously evaporating the powdery evaporating material to produce the vacuum deposition film. According to that process, though it is supposed that a vacuum deposition film having the same composition as that of the evaporating material can always be obtained without regard to the vacuum evaporation time, there are the following problems. Namely, it is very difficult to uniformly drop the powdery evaporating material in a definite amount and the thickness of the films often varies according to the dropping condition. Further, it is difficult to produce an alloy powder having a suitable composition as the evaporating material, and it is often impossible to obtain an alloy powder having the desired composition. Even if a powdery mixture of simple metal substances is used, not only much labor is necessary for uniformly blending but also the mixture becomes nonuniform upon dropping into the evaporation source due to difference in the particle size and specific gravity of the metals in the mixture, and it is consequently difficult to produce the vacuum deposition films having a uniform composition. Further, since the metal powder is rapidly exposed to high temperature upon dropping into the evaporation source it scatters around and cannot be effectively used as the evaporating material. The scattered material adheres to the vacuum deposition film and, consequently, good vacuum deposition films often cannot be obtained.

Further, a process has been proposed which comprises continuously feeding a two component alloy wire having a desired composition to a single evaporation source and instantaneously evaporating the fed alloy wire to produce a vacuum deposition film having the same composition as that of the evaporating material. However, it is often difficult to obtain an alloy wire having a composition suitable for producing vacuum deposition films having a given composition. Further, the vacuum deposition films having a different composition by the evaporation time are often formed, because the composition of the vacuum deposition film gradually varies by the difference of vapor pressure, namely, the difference of evaporation rate, of each component composing the alloy wire.

SUMMARY OF THE INVENTION

A first object of the present invention is to provide a process for producing vacuum deposition films having a definite composition composed of two or more components regardless of the evaporation time using a single evaporation source.

A second object of the present invention is to provide a process for continuously producing vacuum deposition films of an alloy or an intermetallic compound having a definite composition composed of two or more components using a single evaporation source.

The present invention provides a process for producing vacuum deposition films which comprises producing a vacuum deposition film composed of an alloy or an intermetallic compound composed of two or more components having different vapor pressures at a specified temperature on a base, which is characterized by charging the component having the lower vapor pressure at said temperature in an evaporation source in a vacuum evaporation chamber in such a large amount that the evaporation rate thereof does not substantially vary, and carrying out vacuum evaporation while continuously feeding the component having the higher vapor pressure at said temperature into said evaporation source at a rate corresponding to the evaporation rate thereof.

DETAILED DESCRIPTION OF THE INVENTION

Figure 1:
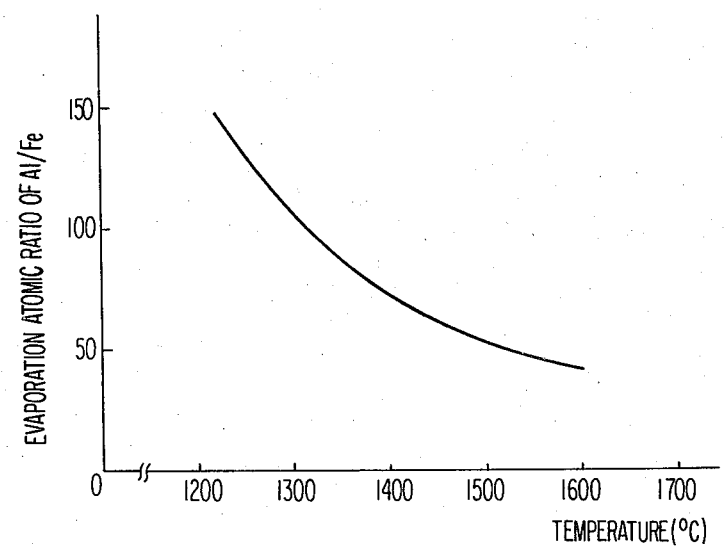
FIG. 1 is a graph which shows the relationship between the evaporation atomic ratio of aluminum to iron and temperature.

When the alloy or the intermetallic compound composed of two or more components each having a different vapor pressure is charged as the evaporating material into a container such as a crucible placed in the evaporation source and evaporated by heating, consumption of the component having the higher vapor pressure is larger than that of the components having the lower vapor pressures. As a result, the composition of the evaporating material initially charged into the container in the evaporation source gradually changes as the amount of the component having the higher vapor pressure gradually decreases and the ratio of the component having the lower vapor pressure gradually increases. Accordingly, the composition of the vacuum deposition film gradually changes over time and portions obtained at the initial stage contain a larger amount of the component having the higher vapor pressure.

In the case of continuously providing the vacuum deposition film of the alloy or the intermetallic compound on a indefinite length base or in the case of providing the vacuum deposition film of the alloy or the intermetallic compound on a sheet or plate by conveying the base or sheet or plate in turn, the composition of the films at an early stage is very different from that of the films at a latter stage. Consequently it is impossible to continuously produce vacuum deposition films having the same composition in large quantities.

The process of the present invention comprises previously charging the component having the lower vapor pressure into the evaporation source in a sufficient amount so that the evaporating surface area remains substantially constant during the vacuum evaporation treatment. In this way, the evaporation amount of the lower vapor pressure material is substantially fixed. The components having the higher vapor pressures are continuously fed to the source such that the vaporized material in the evaporation source has a definite composition, and in turn the vacuum deposition film having a definite composition is obtained regardless of the evaporation time or progress. By previously charging the component having the lower vapor pressure in a sufficient amount that the amount of the component having the lower vapor pressure lost by evaporation is very small as compared with the amount previously charged, the amount of the component having the lower vapor pressure hardly varies, even if evaporation is carried out for a long time and, consequently, the evaporating surface are a of the component having the lower vapor pressure hardly varies. Further, since the evaporation source is maintained at a definite temperature by which the temperature of each component is maintained at a definite value, the evaporation amount of the component having the lower vapor pressure is fixed even if the vacuum evaporation is carried out for a long period of time.

On the other hand, though the component having the higher vapor pressure is gradually lost by evaporation, the amount thereof in the evaporation source can be always maintained at a definite level by continuously feeding it to the evaporation source in an amount corresponding to the amount lost by which a definite evaporation rate is maintained without regard to the evaporation time. This can also be accomplished in some cases by precharging a portion of the components having the higher vapor pressures to the evaporation source mixed with the component having the lower vapor pressure and continuously feeding the higher vapor pressure components to the source in an amount corresponding to the amount lost.

Thus the evaporating material in the evaporation source is always maintained at a definite composition and consequently the vacuum deposition films obtained by evaporation thereof always have a definite composition without regard to the vacuum evaporation time. The composition of the vacuum deposition film is determined by the surface area of the component having the lower vapor pressure charged to the evaporation source and the feed rate of the components having the higher vapor pressures. The ratio of the surface area to the feed rate can be easily determined by persons skilled in the art by a simple experiment or with reference to data described in the literature such that the vapor composition corresponds to the desired film composition, as described in *Handbook of Thin Film Technology*, edited by L. I. Maissel and R. Glang, McGraw-Hill Book Company, New York (1970), pages 1–16 and 1–17.

In the present specification, the component having the lower vapor pressure at a specified temperature and the components having the higher vapor pressures are each a single element or a compound consisting of two or more elements which does not substantially vary throughout the step of evaporation and deposition on the surface of the base. Examples of the former include aluminum, iron, nickel, copper, chromium, silver, gold and platinum. Examples of the latter include ZnS, SiO, $CeO_2$, $MgF_2$, $CeF_2$ and $Na_3AlF_6$.

The process of the present invention can be theoretically practiced if the ratio of the vapor pressure of the components having a higher vapor pressures to that of the component having a lower vapor pressure at a specified temperature is 1 or more. However, when this ratio is 1 to 5, there is no operational or economic advantage to carry out the process of the present invention, because the ratio of the components in the vacuum deposition film at the initial stage of evaporation and that after the lapse of time are not remarkably different when the evaporation is carried out with both components copresent in the evaporation source. On the other hand, there is no upper limit on the above-described ratio. Accordingly, in the process of the present invention, easy operation and a simplified apparatus and economization originate naturally if the ratio of the vapor pressure of the component having the higher vapor pressure to the component having the lower vapor pressure at a specified temperature is about 5 or more and preferably about 10 or more.

The present invention is illustrated with reference to an alloy of aluminum and iron. The vapor pressure of aluminum and that of iron are shown in Table 1. The vapor pressure of aluminum is remarkably different from that of iron.

TABLE 1

| Temperature (°C.) | Al Vapor Pressure (Torr) | Fe Vapor Pressure (Torr) |
|---|---|---|
| 1,300 | $3.6 \times 10^{-2}$ | $4.8 \times 10^{-4}$ |
| 1,400 | $1.5 \times 10^{-1}$ | $2.9 \times 10^{-3}$ |
| 1,500 | $5.2 \times 10^{-1}$ | $1.4 \times 10^{-2}$ |

In general, the evaporation rate G of a metal is theoretically represented by the formula:

$$G = 5.833 \times 10^{-2} \cdot P \sqrt{\frac{M}{T}}$$

The dimension is g/cm²sec. P is a vapor pressure (Torr), M is an atomic weight of the metal and T is an absolute temperature. Thus, in the case of aluminum, P is the vapor pressure of aluminum, M is the atomic weight of aluminum and T is the evaporation temperature. This formula has been described in *Handbook of Thin Film Technology* edited by L. I. Maissel and R. Glang, McGraw-Hill Book Company, New York (1970), page 1-27.

When the evaporation atomic ratio (aluminum/iron) is calculated using the above formula, it varies with temperature as shown in FIG. 1. For example, the evaporation atomic ratio of aluminum to iron at 1,500° C. is 53 to 1. That is, aluminum evaporates in an amount 53 times larger than iron. Thus, when aluminum and iron of the aluminum-iron alloy is fed into the evaporation source and is allowed to evaporate at 1,500° C., the amount of aluminum decreases at a rate of 53 times faster than iron and the ratio of aluminum to iron in the evaporation source rapidly varies. Accordingly, the composition of the vacuum deposition film varies such that the ratio of aluminum to iron rapidly decreases as the evaporation time increases and the ratio of iron increases.

Figure 2:
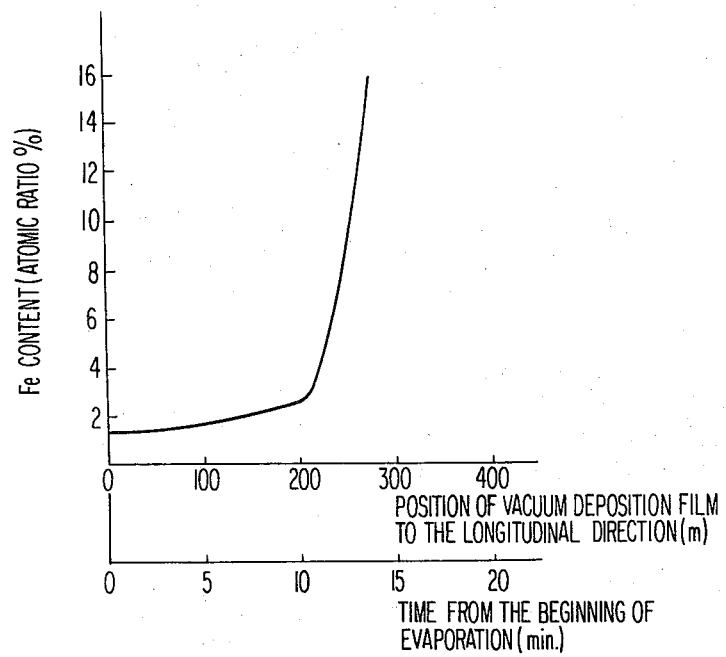
FIG. 2 is a graph which shows the variation of iron content in a vacuum deposition film in the case of vacuum evaporation of an Al-Fe alloy having the composition of $Al_2Fe_1$.

At 1,350° C., the amount of aluminum decreases at a rate 88 times faster than iron. If, for example, 100 g of an alloy composed of Al₁Fe₁ is fed into the evaporation source and vacuum deposition on a polyethylene terephthalate film (base) having a 160 mm width conveyed at a rate of 20 meters/minute is carried out continuously by evaporating at 1,350° C. under $6.6 \times 10^{-5}$ Torrs, the Fe content in the vacuum deposition film gradually increases as shown in FIG. 2 and the composition changes remarkably at the evaporation point of 200 meters. After 10 minutes of evaporation, the Fe content increases remarkably. The reason for this is that the amount of aluminum in the evaporation source remarkably decreases with time and, consequently, the ratio of iron increases, since the evaporation rate of aluminum is higher than that of iron. Thus, by continuously feeding aluminum to the evaporation source to supplement the aluminum lost by vaporation, an aluminum-iron vacuum deposition film having a definite composition is continuously produced without regard to the vacuum evaporation time.

The process of the present invention is particularly suitable in producing the vacuum deposition film from the aluminum-iron alloy if the vacuum deposition film contains iron in the range of about 1 to 15% (atomic ratio). The aluminum may be added by continuously dropping a suitable amount of a powder thereof into the evaporation source or by continuously feeding it as a linear material such as a rod or wire. The method of feeding as a linear material is preferred because it is simple and does not have the defect that the powder scatters to adhere as granules to the base.

While the present invention has been explained with reference to the deposition of Al-Fe films, it will be clear to those skilled in the art that teachings of the present invention are equally applicable to the deposition of other two component films based on their respective evaporation rates. In particular, combinations of Al-Ni, Al-Au and Ag-Cu can be employed. The vapor pressures of aluminum, nickel, silver, copper and gold are compared in Table 2 below.

TABLE 2

| Temperature (°C.) | Al Vapor Pressure (Torr) | Ni Vapor Pressure (Torr) | Au Vapor Pressure (Torr) |
|---|---|---|---|
| 1,300 | $3.6 \times 10^{-2}$ | $1.8 \times 10^{-4}$ | $7.5 \times 10^{-4}$ |
| 1,400 | $1.5 \times 10^{-1}$ | $1.2 \times 10^{-3}$ | $4.0 \times 10^{-3}$ |
| 1,500 | $5.2 \times 10^{-1}$ | $8.5 \times 10^{-3}$ | $1.5 \times 10^{-2}$ |

| Temperature (°c.) | Ag Vapor Pressure (Torr) | Cu Vapor Pressure (Torr) |
|---|---|---|
| 1,100 | $3 \times 10^{-2}$ | $4.5 \times 10^{-4}$ |
| 1,200 | $1.5 \times 10^{-1}$ | $3 \times 10^{-3}$ |
| 1,300 | $6 \times 10^{-1}$ | $1.5 \times 10^{-2}$ |

The present invention is illustrated in greater detail below by reference to the following examples.

EXAMPLE 1

Figure 3:
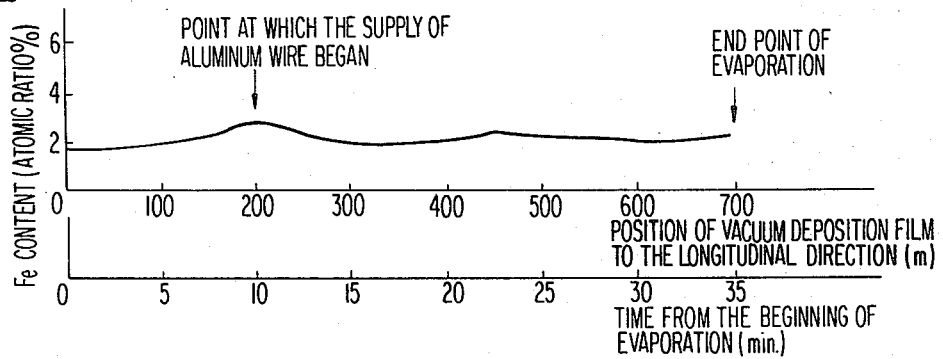
FIG. 3, FIG. 4 and FIG. 5 are each graphs which show the variation of iron content in the vacuum deposition film in Examples 1, 2 and 3, respectively.

In a continuous vacuum evaporation apparatus, 100 g of an alloy having the composition of Al₂F₁ (purity: 99.90 wt% or more, containing 0.06 wt% or less of silicon) was charged to an evaporation source. After it was maintained under $5.5 \times 10^{-5}$ Torrs of the vacuum, the temperature was elevated to 1,480° C. by heating the evaporation source to melt the Al₂Fe₁ alloy. A shutter provided on the upper part of the evaporation source was closed till the alloy sufficiently melted. After sufficient melting, the shutter was opened to form a vacuum deposition film on an indefinite length polyethylene terephthalate base having 160 mm of the width and 100 μm of the thickness conveyed over the upper part of the shutter at the rate of 20 m/minute. After 10 minutes from the beginning of the vacuum evaporation by opening the shutter, an aluminum wire having 1.0 mm of the diameter (purity: 99.70 wt% or more, iron: 0.25 wt% or less, and silicon: 0.20 wt% or less) was continuously fed into the evaporation source at the rate of 90 cm/minute by a wire feed apparatus provided by the side of the evaporation source to evaporate said aluminum wire by melting. After 35 minutes from the beginning of the vacuum evaporation, the shutter was closed to finish the vacuum evaporation. During the vacuum evaporation, the temperature of the evaporation source was maintained at 1,480° C. The length of the vacuum deposition polyethylene terephthalate base was 700 m. When the composition of the aluminum-iron alloy vacuum deposition layer on the polyethylene terephthalate base was analyzed along the lengthwise direction by X-ray fluorometry, the Fe content was in the range of 1.8 to 3.0% (atomic ratio), which was nearly fixed in the practical viewpoint (FIG. 3).

EXAMPLE 2

Figure 4:
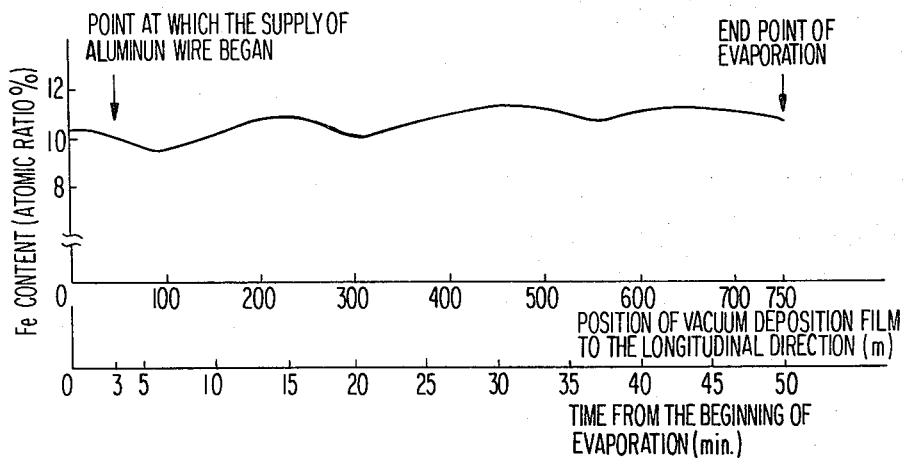

In the same continuous vacuum evaporation apparatus as in Example 1, 100 g of an alloy having the composition of $Al_1Fe_2$ (purity: 99.90 wt% or more, containing 0.07 wt% or less of silicon) was charged into the evaporation source. After it was maintained under $5.0 \times 10^{-5}$ Torrs of the vacuum, the temperature was elevated to 1,500° C. by heating the evaporation source to melt the $Al_1Fe_2$ alloy. A shutter provided on the upper part of the evaporation source was closed till the alloy melted sufficiently. After sufficient melting, the shutter was opened to form a vacuum deposition film on an indefinite length polyethylene terephthalate base having 160 mm of the width and 100 μm of the thickness conveyed over the upper part of the shutter at the rate of 15 meters/min. After 3 minutes from the beginning of the vacuum evaporation by opening the shutter, an aluminum wire having 10 mm of the diameter (purity is the same as that of the aluminum used in Example 1) was continuously fed into the evaporation source at the rate of 64 cm/minute by a wire feed apparatus provided by the side of the evaporation source to evaporate said aluminum wire by melting. After 50 minutes from the beginning of the vacuum evaporation, the shutter was closed to finish the vacuum evaporation. During the vacuum evaporation, the temperature of the evaporation source was maintained at 1,500° C. The length of the vacuum deposition polyethylene terephthalate base was 750 m. When the composition of the aluminum-iron alloy vacuum deposition layer on the polyethylene terephthalate base was analyzed along the lengthwise direction by X-ray fluorometry, the Fe content was in the range of 9.4 to 11.1% (atomic ratio), which was nearly fixed in the practical viewpoint (FIG. 4).

EXAMPLE 3

Figure 5:
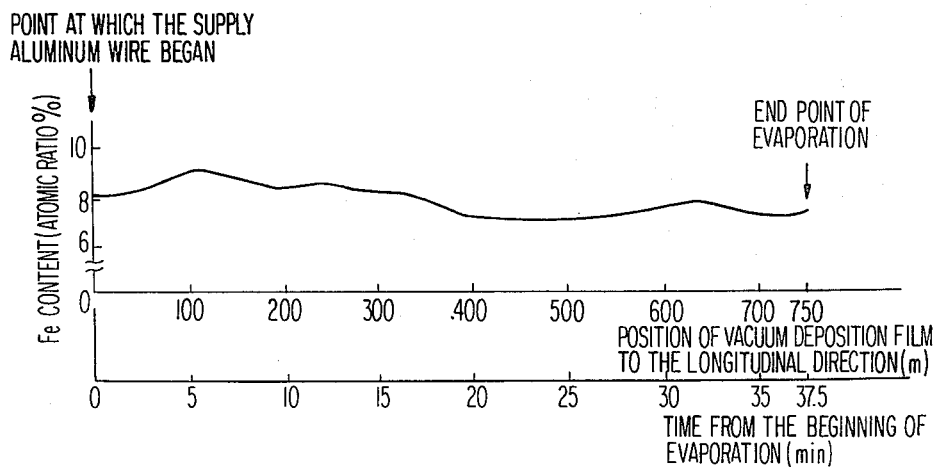

In the same continuous vacuum evaporation apparatus as in Example 1, 50 g of iron was charged into the evaporation source. After it was maintained under $8.0 \times 10^{-5}$ Torrs of the vacuum, the temperature of the evaporation source was elevated to 1,540° C. to melt the iron, while an aluminum wire having 0.8 mm of the diameter (purity is the same as that of the aluminum wire used in Example 1) was fed into the evaporation source at the rate of 150 cm/minute by a wire feed apparatus provided by the side of the evaporation source to evaporate by melting, by which a vacuum deposition film was formed on an indefinite length polyethylene terephthalate base having 160 mm of the width and 100 μm of the thickness conveyed at the rate of 20 meters/minute over the evaporation source. After 37.5 minutes from the beginning of the vacuum evaporation, the shutter was closed to finish the vacuum evaporation. During the vacuum evaporation, the temperature of the evaporation source was maintained at 1,540° C. The length of the vacuum deposited polyethylene terephthalate base was 750 m. When the composition of the aluminum-iron alloy vacuum deposition layer on the polyethylene terephthalate base was analyzed along the lengthwise direction by X-ray fluorometry, the Fe content was in the range of 6.9 to 9.2% (atomic ratio), which was nearly fixed in the practical viewpoint (FIG. 5).

In the above, though cases of aluminum and iron have been illustrated as examples, the process of the present invention is not limited to the cases of aluminum and iron, and it can be applied effectively to production of vacuum deposition films of an alloy or an intermetallic compound composed of other two or more components having each a different vapor pressure.

While the invention has been described in detail and with reference to specific embodiments thereof, it will be apparent to one skilled in the art that various changes and modifications can be made therein without departing from the spirit and scope thereof.

What is claimed is:

1. In a process for producing vacuum deposition films which comprises providing a vacuum deposition film composed of an alloy or an intermetallic compound of two or more components having different vapor pressures at a specified temperature on a base, the improvement which comprises charging the component having the lower vapor pressure at said temperature to an evaporation source in a vacuum evaporation chamber in such an amount that the evaporation amount thereof per unit time does not substantially vary, and carrying out vacuum evaporation while continuously feeding a component having a higher vapor pressure at said temperature into said evaporation source in an amount such that said components in said evaporation source maintain a definite composition thereby to obtain a definite composition of said deposited film.

2. The process of claim 1, wherein said base is an indefinite length base and is continuously fed through the evaporation chamber at a constant rate.

3. The process of claim 1 or 2, wherein upon initiating evaporation a portion of a component having a higher vapor pressure is present together with the component having the lower vapor pressure in said evaporation source.

4. The process of claim 1 or 2, wherein the component having the lower vapor pressure is iron and the component having the higher vapor pressure is aluminum.

5. The process of claim 1 or 2, wherein the component having the lower vapor pressure is iron, the component having the higher vapor pressure is aluminum, and the previously charged material consisting of the component having the higher vapor pressure and the component having the lower vapor pressure is an aluminum-iron alloy.

6. The process of claim 1 or 2, wherein the component having the higher vapor pressure is continuously fed into said evaporation source as a wire or rod.

7. The process of claim 4, wherein the aluminum is an aluminum wire or an aluminum rod.

* * * * *